United States Patent
Barve et al.

(10) Patent No.: US 11,196,230 B2
(45) Date of Patent: Dec. 7, 2021

(54) IMPEDANCE COMPENSATION ALONG A CHANNEL OF EMITTERS

(71) Applicant: Lumentum Operations LLC, Milpitas, CA (US)

(72) Inventors: Ajit Vijay Barve, San Jose, CA (US); Benjamin Kesler, Sunnyvale, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 127 days.

(21) Appl. No.: 16/217,790

(22) Filed: Dec. 12, 2018

(65) Prior Publication Data

US 2019/0199063 A1 Jun. 27, 2019

Related U.S. Application Data

(60) Provisional application No. 62/610,708, filed on Dec. 27, 2017.

(51) Int. Cl.
| | |
|---|---|
| *H01S 5/183* | (2006.01) |
| *H01S 5/42* | (2006.01) |
| *H01S 5/042* | (2006.01) |
| *H01S 5/062* | (2006.01) |
| *H01S 5/20* | (2006.01) |
| *H01S 5/02325* | (2021.01) |

(52) U.S. Cl.
CPC ........ *H01S 5/18305* (2013.01); *H01S 5/0427* (2013.01); *H01S 5/18311* (2013.01); *H01S 5/18344* (2013.01); *H01S 5/18369* (2013.01); *H01S 5/18394* (2013.01); *H01S 5/423* (2013.01); *H01S 5/02325* (2021.01); *H01S 5/06226* (2013.01); *H01S 5/18308* (2013.01); *H01S 5/2063* (2013.01)

(58) Field of Classification Search
CPC .. H01S 5/18305; H01S 5/18394; H01S 5/423; H01S 5/0427; H01S 5/18369; H01S 5/18344; H01S 5/18311; H01S 5/06226; H01S 5/2063; H01S 5/02248; H01S 5/18308
See application file for complete search history.

(56) References Cited

U.S. PATENT DOCUMENTS

| | | | |
|---|---|---|---|
| 2002/0114369 A1* | 8/2002 | Kinoshita | H01S 5/1071 372/46.01 |
| 2013/0083304 A1* | 4/2013 | Kondo | H01S 5/18358 355/55 |
| 2013/0163627 A1* | 6/2013 | Seurin | H01S 5/423 372/36 |
| 2016/0141839 A1* | 5/2016 | Matsubara | H01S 5/0042 372/38.05 |

* cited by examiner

*Primary Examiner* — Xinning(Tom) Niu
(74) *Attorney, Agent, or Firm* — Harrity & Harrity, LLP

(57) ABSTRACT

An emitter array may comprise a plurality of emitters and a metallization layer to electrically connect the plurality of emitters. The metallization layer may have a first end and a second end. The plurality of emitters may include a first emitter and a second emitter. The first emitter may be located closer to the first end than the second emitter. The first emitter and the second emitter have differently sized structures to compensate for a first impedance of the metallization layer between the first end and the first emitter and a second impedance between the first end and the second emitter.

20 Claims, 7 Drawing Sheets

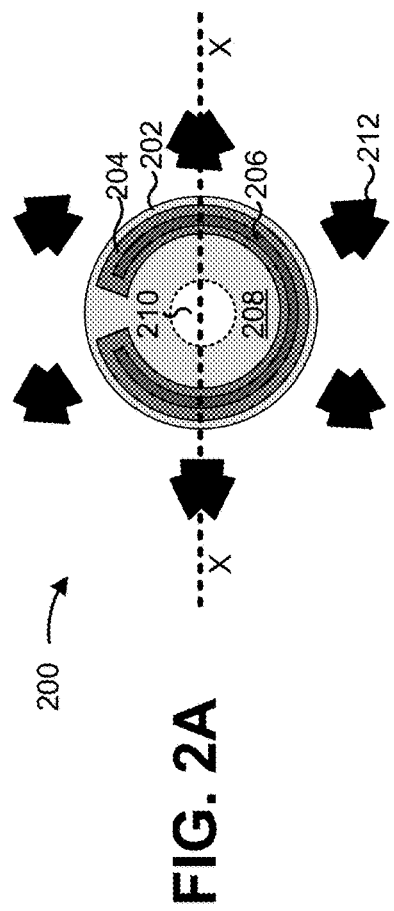
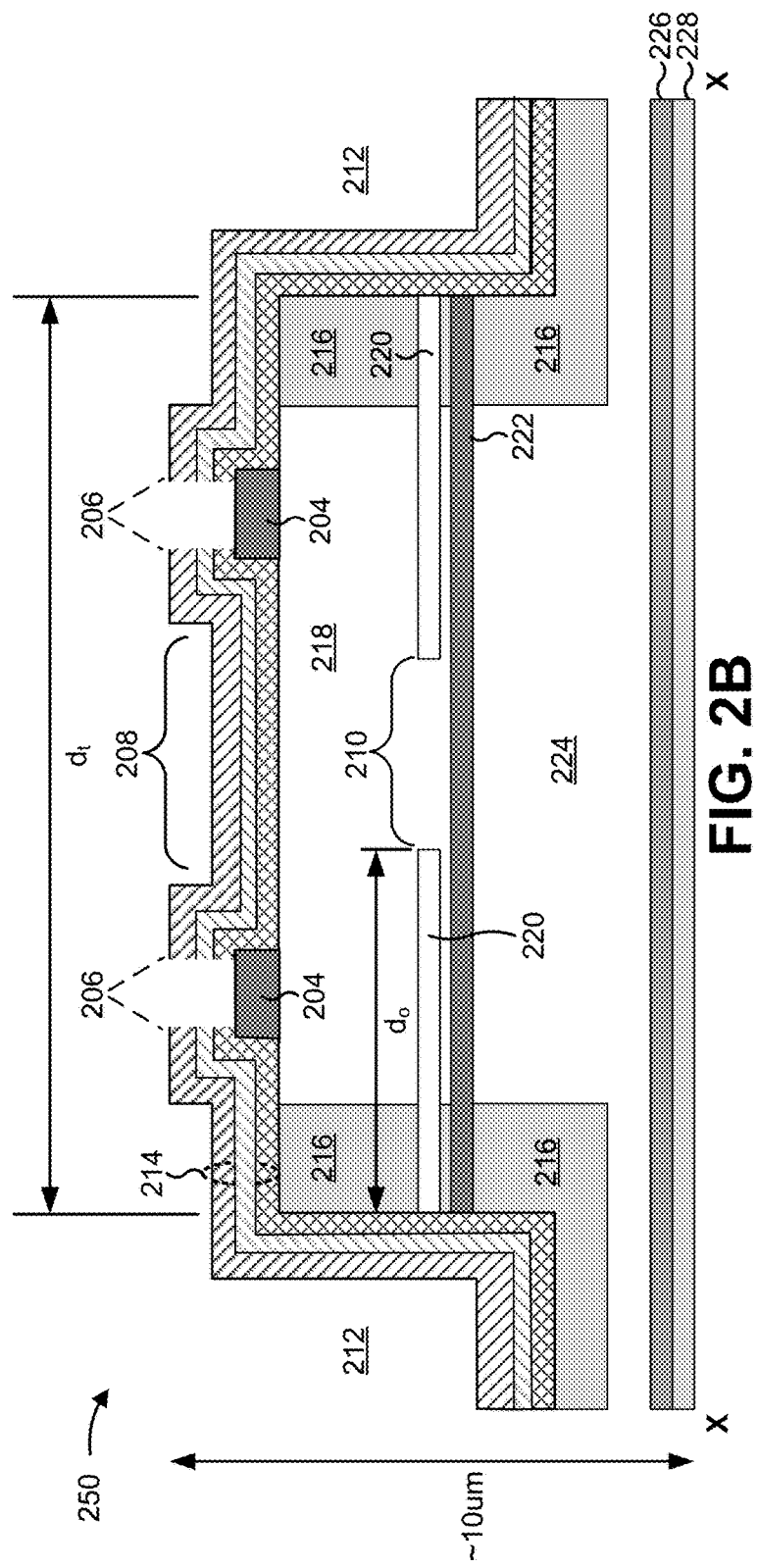
FIG. 2A
FIG. 2B

IMPEDANCE COMPENSATION ALONG A CHANNEL OF EMITTERS

RELATED APPLICATIONS

This application claims priority under 35 U.S.C. § 119 to U.S. Provisional Patent Application No. 62/610,708, filed on Dec. 27, 2017, the content of which is incorporated by reference herein in its entirety.

TECHNICAL FIELD

The present disclosure relates to an emitter array and, more particularly, to impedance compensation along an emitter array.

BACKGROUND

A vertical-emitting device, such as a vertical cavity surface emitting laser (VCSEL), is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

According to some possible implementations, a vertical cavity surface emitting laser (VCSEL) array may comprise: a plurality of VCSELs; and a metallization layer to electrically connect the plurality of VCSELs, wherein the metallization layer has a first end and a second end, wherein the plurality of VCSELs includes a first VCSEL and a second VCSEL, wherein the first VCSEL is located closer to the first end than the second VCSEL, wherein a first structure of the first VCSEL is different than a second structure of the second VCSEL in accordance with a difference in a first electrical impedance of the first VCSEL and a second electrical impedance of the second VCSEL when the metallization layer is powered.

According to some possible implementations, an emitter array may comprise: a plurality of emitters; and a metallization layer to electrically connect the plurality of emitters, wherein the metallization layer has a first end and a second end, wherein the plurality of emitters includes a first emitter and a second emitter, wherein the first emitter is located closer to the first end than the second emitter, wherein the first emitter and the second emitter have differently sized structures to compensate for a first impedance of the metallization layer between the first end and the first emitter and a second impedance between the first end and the second emitter.

According to some possible implementations, a laser array may comprise: a plurality of laser devices; and a metallization layer to electrically connect the plurality of laser devices, wherein the metallization layer has a first end and a second end, wherein the plurality of laser devices includes a first laser device and a second laser device, wherein the first laser device is located closer to the first end than the second laser device, wherein the first laser device and the second laser device have different structures that are configured such that a difference between a first input power to the first laser device and a second input power to the second laser device satisfies a threshold.

According to some possible implementations, a time of flight light detection and ranging (LIDAR) system may include an array of emitters that have uniform channels of power, wherein the uniform channels are formed by varying an impedance along a metallization layer that electrically connects emitters of the array of emitters. According to some possible implementations, a time of flight LIDAR system may comprise a vertical cavity surface emitting laser (VCSEL) array that comprises: a plurality of VCSELs; and a metallization layer to electrically connect the plurality of VCSELs, wherein the metallization layer has a first end and a second end, wherein the plurality of VCSELs includes a first VCSEL and a second VCSEL, wherein the first VCSEL is located closer to the first end than the second VCSEL, wherein a first structure of the first VCSEL is different than a second structure of the second VCSEL in accordance with a difference in a first electrical impedance of the first VCSEL and a second electrical impedance of the second VCSEL when the metallization layer is powered.

According to some possible implementations, a time of flight LIDAR system may comprise an emitter array that comprises: a plurality of emitters; and a metallization layer to electrically connect the plurality of emitters, wherein the metallization layer has a first end and a second end, wherein the plurality of emitters includes a first emitter and a second emitter, wherein the first emitter is located closer to the first end than the second emitter, wherein the first emitter and the second emitter have differently sized structures to compensate for a first impedance of the metallization layer between the first end and the first emitter and a second impedance between the first end and the second emitter.

According to some possible implementations, a time of flight LIDAR system may comprise a laser array that comprises: a plurality of laser devices; and a metallization layer to electrically connect the plurality of laser devices, wherein the metallization layer has a first end and a second end, wherein the plurality of laser devices includes a first laser device and a second laser device, wherein the first laser device is located closer to the first end than the second laser device, wherein the first laser device and the second laser device have different structures that are configured such that a difference between a first input power to the first laser device and a second input power to the second laser device satisfies a threshold.

BRIEF DESCRIPTION OF THE DRAWINGS

FIGS. 2A and 2B are diagrams depicting a top-view of an example vertical-emitting device and a cross-sectional view of the example vertical-emitting device, respectively;

DETAILED DESCRIPTION

Figure 1A:
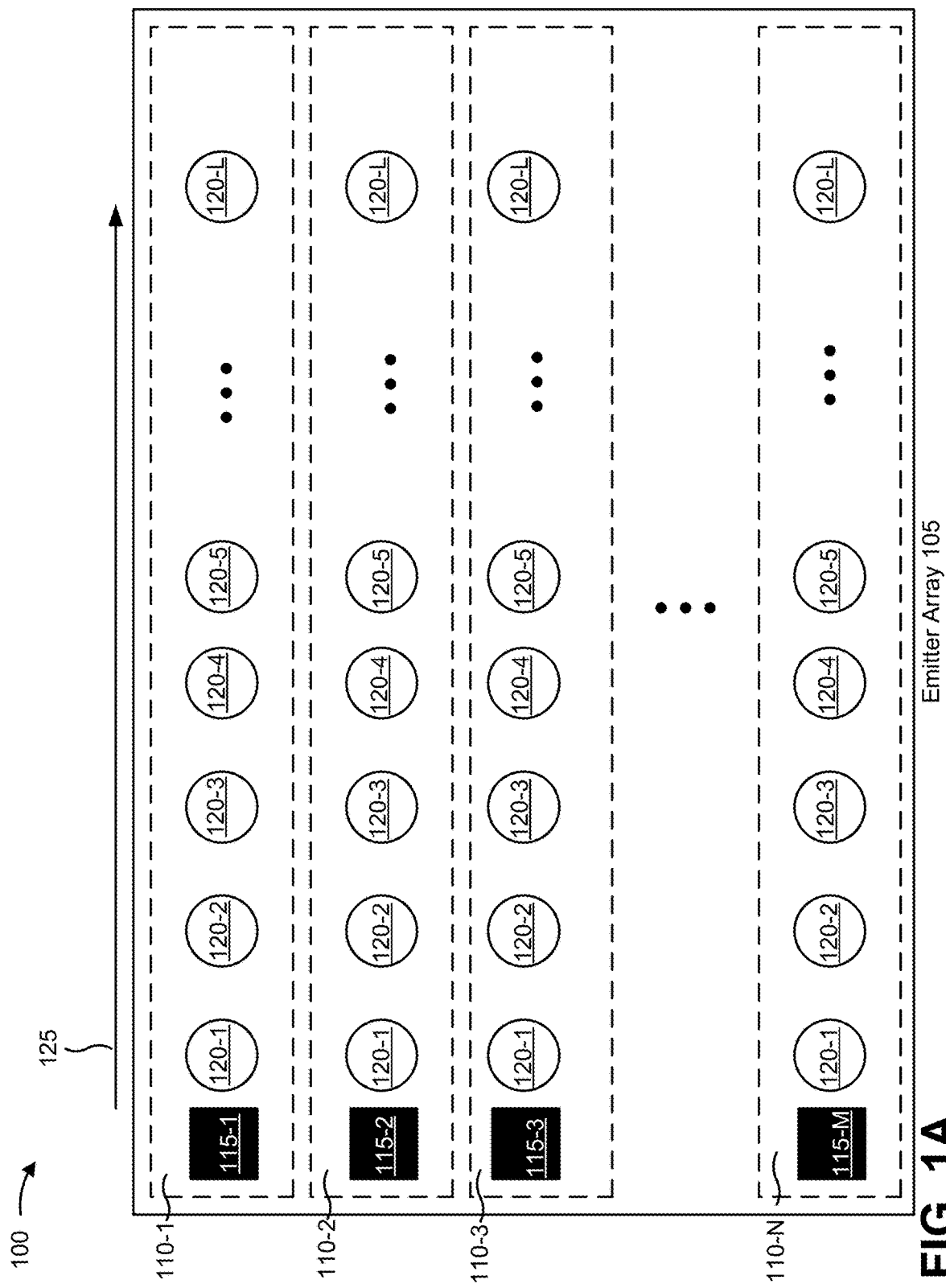
FIGS. 1A and 1B are diagrams depicting a top-view of an example emitter array that includes variations in electrical impedance along the example emitter array and a chart showing the input electrical power along the emitter array, respectively.

The following detailed description of example implementations refers to the accompanying drawings. The same reference numbers in different drawings may identify the same or similar elements.

An emitter array, such as a high power or high speed emitter array, may include various sub-arrays (e.g., channels), such as rows or columns or other two dimensional combinations of emitters, that are electrically isolated from each other. Within a sub-array, emitters may be electrically connected (e.g., in parallel or in series, depending on the context) via a metallization layer and the sub-array may be electrically connected at a first end of the sub-array to a laser driver. When the laser driver is powered, electrical current may flow from the first end of the sub-array to a second end of the sub-array to power the emitters of the sub-array (e.g., via the metallization layer). However, emitters that are further from the laser driver (e.g., closer to the second end of the sub-array) may receive less voltage relative to emitters that are closer to the laser driver (e.g., closer to the first end of the sub-array) due to impedance along the metallization layer. For example, if the metallization layer between adjacent emitters is too narrow or too thin there may be a significant voltage drop between the adjacent emitters. This negative impact on voltage along the metallization layer may negatively impact a performance of the sub-array and/or of the emitter array.

As a specific example, for time of flight applications, powering a sub-array at ultrashort pulse widths (e.g., 0.1 to 50 nanoseconds (ns)) may be desirable. At these ultrashort pulse widths, an impedance of a metallization layer that electrically connects emitters of the sub-array may have a significant impact on performance of the sub-array. For example, impedance of the metallization layer may be comprised of a frequency independent resistive part and a frequency dependent inductive part (e.g., defined by the equation $Z=2\times\pi\times f\times L+R_s$, where $\pi$ is pi, f is a frequency of operation of the sub-array, L is an inductance of the metallization layer, and $R_s$ is a resistance of the metallization layer). The impedance of the metallization layer may result in less optical power output from an emitter the further the emitter is located in the sub-array from a laser driver associated with the sub-array. This non-uniformity of optical output power within the sub-array may impact a performance of a sensor used in time-of-flight applications.

While increasing a width and/or thickness of a metallization layer may reduce an inductance and/or a resistance of the metallization layer, increasing the size of the metallization layer may be limited. For example, increasing the size of the metallization layer may not be possible beyond a particular point without increasing spacing between adjacent emitters of a sub-array, increasing the space between adjacent sub-arrays of an emitter array, and/or increasing a footprint of the emitter array. This increases the cost of producing an emitter array with various sub-arrays.

Some implementations described herein provide a sub-array where a structure of emitters of the sub-array varies along the sub-array in one or more ways to compensate for impedance of a metallization layer of the sub-array (e.g., in accordance with different electrical impedances of different emitters). For example, a size of current confinement apertures, a size of implant isolation material, and/or a size of metal contacts may vary along the sub-array to compensate for impedance of a metallization layer of the sub-array. In this way, emitters of a sub-array may be configured such that the emitters receive a threshold amount of voltage, receive an amount of voltage within a range of voltages, receive an amount of voltage that is within a threshold amount of each other, and/or the like, regardless of a position of the emitters in the sub-array relative to a laser driver. This improves a performance of the sub-array via compensation of voltage drop across the impedance along the sub-array. In addition, this reduces or eliminates failure of emitters in a sub-array when the emitters are located further from a laser driver. Further, this conserves costs and/or production resources that would otherwise be consumed replacing an emitter array that has one or more failed emitters resulting from impedance along a sub-array. Further, this facilitates emitter arrays of a smaller footprint relative to prior techniques (e.g., where dimensions of the metallization layer were modified to compensate for impedance of the metallization layer), thereby conserving costs related to producing emitter arrays.

Figure 1B:
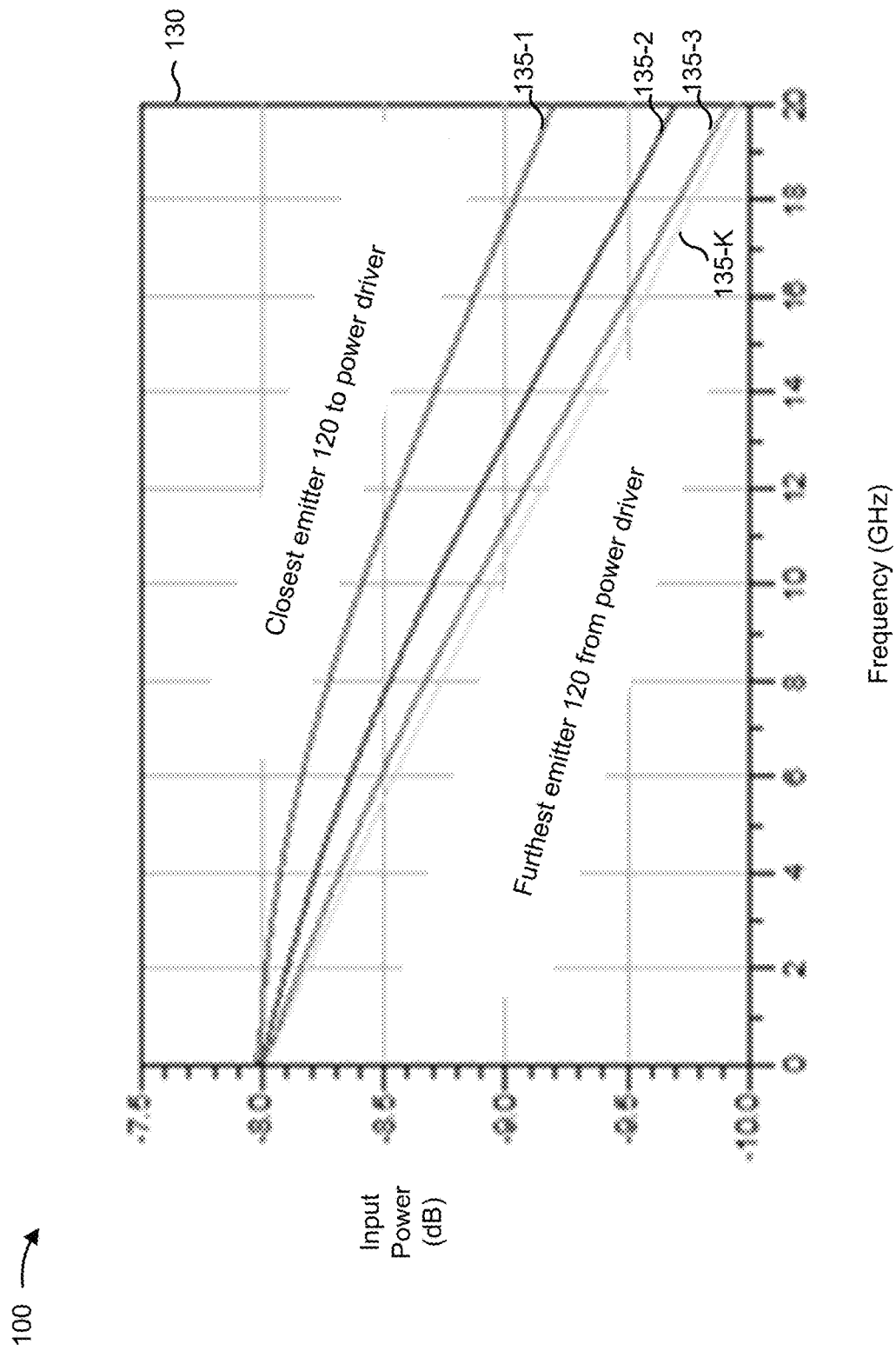

FIGS. 1A and 1B are diagrams 100 depicting a top-view of an example emitter array that includes electrical impedance along the example emitter array and a chart showing the input electrical power along the emitter array, respectively.

As shown in FIG. 1A, diagram 100 includes emitter array 105. For example, emitter array 105 may be a vertical cavity surface emitting laser (VCSEL) array, an array of vertical-emitting devices, an array of light-emitting devices, a laser array, and/or the like. As further shown, emitter array 105 may include sub-arrays 110-1 through 110-N (e.g., may include channels of emitters). Sub-arrays 110-1 through 110-N may be electrically isolated from each other. As further shown, emitter array 105 may include laser drivers 115-1 through 115-M (e.g., configured to power emitters 120). For example, a particular sub-array 110 may include a corresponding laser driver 115. In some implementations, one laser driver 115 may be shared across one or more sub-arrays 110. In some implementations, one or more sub-arrays 110 may have more than one laser driver 115.

As further shown, a particular sub-array 110 may include emitters 120-1 through 120-L. For example, emitter 120 may be a VCSEL, a laser, a light-emitting device, a vertical-emitting device, a laser device, and/or the like. Emitters 120-1 through 120-L of sub-array 110 may be electrically connected to each other and to laser driver 115 via a metallization layer on a surface of sub-array 110. For example, the metallization layer may be a layer of gold, silver, aluminum, copper, and/or the like.

As shown by reference number 125, electric current may flow from a first end of sub-array 110 to a second end of sub-array 110 via the metallization layer. For example, the electric current may flow from laser driver 115 to emitter 120-L (e.g., from an end closest to laser driver 115 to an end furthest from laser driver 115). As the electrical current flows from the first end of sub-array 110 to the second end of sub-array 110, an impedance of the metallization layer may impact an amount of voltage received by emitters 120 of sub-array 110. For example, emitters 120 that are closer to laser driver 115 may receive more voltage relative to emitters 120 that are further from laser driver 115 (e.g., emitters 120 closer to the first end of sub-array 110 may receive more voltage relative to emitters 120 that are closer to the second end of sub-array 110). The reduction in voltage across sub-array 110 may negatively impact a performance of one or more emitters 120 of sub-array 110 and/or a performance of sub-array 110 (e.g., due to an amount of voltage received by the one or more emitters 120 failing to satisfy a threshold, failing to be within a range of voltages, failing to be with a threshold amount of voltage received by other emitters 120 of the same sub-array 110, etc.).

Turning to FIG. 1B, reference number 130 shows an example chart of the input electrical power along sub-array 110. For example, and as shown by reference numbers 135-1 through 135-K, given an amount of input power (e.g., −8.0 decibels (dB) of input power), the amount of power received by emitters 120 of sub-array 110 as a function of frequency (e.g., gigahertz (GHz)) may drop across emitters 120 the further the emitters 120 are located from laser driver 115. Continuing with the previous example, a first emitter 120 (e.g., corresponding to reference number 135-1) may receive more power relative to a second emitter 120 (e.g., corresponding to reference number 135-2), which may receive more power relative to a third emitter 120 (e.g., corresponding to reference number 135-3), and so forth. In this case, the first emitter 120 may be located closer to laser driver 115 relative to the second emitter 120, which may be located closer to laser driver 115 relative to the third emitter 120, and so forth.

In this way, sub-array 110 may experience a drop in voltage across emitters 120 of sub-array 110. For example, the drop in voltage may be due to an impedance of a metallization layer of sub-array 110. This drop in voltage can negatively impact a performance of emitter array 105, sub-array 110, particular emitters 120, and/or the like. Some implementations described herein provide a sub-array of emitters, where a structure of the emitters is modified along the sub-array to compensate for an impedance of a metallization layer of the sub-array, as described elsewhere herein.

As indicated above, FIGS. 1A and 1B are provided merely as an example. Other examples are possible and may differ from what was described with regard to FIGS. 1A and 1B.

FIGS. 2A and 2B are diagrams depicting a top-view of an example emitter 200 and a cross-sectional view 250 of example emitter 200, respectively. As shown in FIG. 2A, emitter 200 may include a set of emitter layers constructed in an emitter architecture. In some implementations, emitter 200 may correspond to one or more vertical-emitting devices described herein (e.g., an oxide and implant emitter 200, an implant only emitter 200, an oxide only emitter 200, and/or the like).

As shown in FIG. 2A, emitter 200 includes an implant protection layer 202 that is circular in shape in this example. In some implementations, implant protection layer 202 may have another shape, such as an elliptical shape, a polygonal shape, or the like. Implant protection layer 202 is defined based on a space between sections of implant material included in emitter 200 (not shown). As shown by the medium gray area in FIG. 2A, emitter 200 includes a P-Ohmic metal layer 204 that is constructed in a partial ring-shape (e.g., with an inner radius and an outer radius). As shown, P-Ohmic metal layer 204 overlaps with implant protection layer 202. Such configuration may be used, for example, in the case of a P-up/top-emitting emitter 200. In the case of a bottom-emitting emitter 200, the configuration may be adjusted as needed.

As further shown in FIG. 2A, emitter 200 includes a dielectric via opening 206 that is formed (e.g., etched) on a dielectric passivation/mirror layer that covers P-Ohmic metal layer 204 (not shown). As shown, dielectric via opening 206 is formed in a partial ring-shape (e.g., similar to P-Ohmic metal layer 204) and is formed over P-Ohmic metal layer 204 such that metallization of the dielectric passivation/mirror layer contacts P-Ohmic metal layer 204. In some implementations, dielectric opening 206 and/or P-Ohmic metal layer 204 may be formed in another shape, such as a full ring-shape or a split ring-shape.

As further shown, emitter 200 includes an optical aperture 208 in a portion of the emitter within the inner radius of the partial ring-shape of P-Ohmic metal layer 204. Emitter 200 emits a laser beam via optical aperture 208. As further shown, emitter 200 also includes a current confinement aperture 210 (e.g., an oxide aperture formed by an oxidation layer of emitter 200 (not shown)). Current confinement aperture 210 is formed below optical aperture 208.

As further shown in FIG. 2A, emitter 200 includes a set of oxidation trenches 212 that are spaced (e.g., equally, unequally) around a circumference of implant protection layer 202. How close oxidation trenches 212 can be positioned relative to the optical aperture 208 is dependent on the application, and is typically limited by implant protection layer 202, P-Ohmic metal layer 204, dielectric via opening 206, and manufacturing tolerances.

The number and arrangement of layers shown in FIG. 2A are provided as an example. In practice, emitter 200 may include additional layers, fewer layers, different layers, or differently arranged layers than those shown in FIG. 2A. For example, while emitter 200 includes a set of six oxidation trenches 212, in practice, other designs are possible, such as a compact emitter that includes five oxidation trenches 212, seven oxidation trenches 212, and/or the like. In some implementations, oxidation trench 212 may encircle emitter 200 to form a mesa structure. As another example, while emitter 200 is a circular emitter design, in practice, other designs are possible, such as a rectangular emitter, a hexagonal emitter, an elliptical emitter, or the like. Additionally, or alternatively, a set of layers (e.g., one or more layers) of emitter 200 may perform one or more functions described as being performed by another set of layers of emitter 200, respectively.

Notably, while the design of emitter 200 is described as including a VCSEL, other implementations are possible. For example, the design of emitter 200 may apply in the context of another type of optical device, such as a light emitting diode (LED), or another type of vertical emitting (e.g., top emitting or bottom emitting) optical device. Additionally, the design of emitter 200 may apply to emitters of any wavelength, power level, emission profile, or the like. In other words, emitter 200 is not particular to an emitter with a given performance characteristic.

As shown in FIG. 2B, the example cross-sectional view may represent a cross-section of emitter 200 that passes through a pair of oxidation trenches 212 (e.g., as shown by the line labeled "X-X" in FIG. 2A). As shown, emitter 200 may include a backside cathode layer 228, a substrate layer 226, a bottom mirror 224, an active region 222, an oxidation layer 220, a top mirror 218, an implant isolation material 216, a dielectric passivation/mirror layer 214, and a P-Ohmic metal layer 204. As shown, emitter 200 may have a total height that is approximately 10 µm.

Backside cathode layer 228 may include a layer that makes electrical contact with substrate layer 226. For example, backside cathode layer 228 may include an annealed metallization layer, such as an AuGeNi layer, a PdGeAu layer, or the like.

Substrate layer 226 may include a base substrate layer upon which epitaxial layers are grown. For example, substrate layer 226 may include a semiconductor layer, such as a GaAs layer, an InP layer, and/or the like.

Bottom mirror 224 may include a bottom reflector layer of emitter 200. For example, bottom mirror 224 may include a distributed Bragg reflector (DBR).

Active region 222 may include a layer that confines electrons and defines an emission wavelength of emitter 200. For example, active region 222 may be a quantum well.

Oxidation layer 220 may include an oxide layer that provides optical and electrical confinement of emitter 200. In some implementations, oxidation layer 220 may be formed as a result of wet oxidation of an epitaxial layer. For example, oxidation layer 220 may be an $Al_2O_3$ layer formed as a result of oxidation of an AlAs or AlGaAs layer. Oxidation trenches 212 may include openings that allow oxygen (e.g., dry oxygen, wet oxygen) to access the epitaxial layer from which oxidation layer 220 is formed.

Current confinement aperture 210 may include an optically active aperture defined by oxidation layer 220. A size of current confinement aperture 210 may range, for example, from approximately 4.0 μm to approximately 20.0 μm. In some implementations, a size of current confinement aperture 210 may depend on a distance between oxidation trenches 212 that surround emitter 200. For example, oxidation trenches 212 may be etched to expose the epitaxial layer from which oxidation layer 220 is formed. Here, before dielectric passivation/mirror layer 214 is deposited, oxidation of the epitaxial layer may occur for a particular distance (e.g., identified as $d_o$ in FIG. 2B) toward a center of emitter 200, thereby forming oxidation layer 220 and current confinement aperture 210. In some implementations, current confinement aperture 210 may include an oxide aperture. Additionally, or alternatively, current confinement aperture 210 may include an aperture associated with another type of current confinement technique, such as an etched mesa, a region without ion implantation, lithographically defined intra-cavity mesa and regrowth, or the like.

Top mirror 218 may include a top reflector layer of emitter 200. For example, top mirror 218 may include a DBR.

Implant isolation material 216 may include a material that provides electrical isolation. For example, implant isolation material 216 may include an ion implanted material, such as a Hydrogen/Proton implanted material or a similar implanted element to reduce conductivity. In some implementations, implant isolation material 216 may define implant protection layer 202.

Dielectric passivation/mirror layer 214 may include a layer that acts as a protective passivation layer and that acts as an additional DBR. For example, dielectric passivation/mirror layer 214 may include one or more sub-layers (e.g., a $SiO_2$ layer, a $Si_3N_4$ layer) deposited (e.g., via chemical vapor deposition) on one or more other layers of emitter 200.

As shown, dielectric passivation/mirror layer 214 may include one or more dielectric via openings 206 that provide electrical access to P-Ohmic metal layer 204. Optical aperture 208 may include a portion of dielectric passivation/mirror layer 214 over current confinement aperture 210 via which light may be emitted.

P-Ohmic metal layer 204 may include a layer that makes electrical contact via which electrical current may flow. For example, P-Ohmic metal layer 204 may include a TiAu layer, a TiPtAu layer, or the like, via which electrical current may flow (e.g., via a bondpad (not shown) that contacts P-Ohmic metal layer 204 through dielectric via openings 206).

In some implementations, emitter 200 may be manufactured using a series of steps. For example, bottom mirror 224, active region 222, oxidation layer 220, and top mirror 218 may be epitaxially grown on substrate layer 226, after which P-Ohmic metal layer 204 may be deposited on top mirror 218. Next, oxidation trenches 212 may be etched to expose oxidation layer 220 for oxidation. Implant isolation material 216 may be created via ion implantation, after which dielectric passivation/mirror layer 214 may be deposited. Dielectric via openings 206 may be etched in dielectric passivation/mirror layer 214 (e.g., to expose P-Ohmic metal layer for contact). Plating, seeding, and etching may be performed, after which substrate layer 226 may be thinned and/or lapped to a target thickness. Finally, backside cathode layer 228 may be deposited on a bottom side of substrate layer 226.

The number, arrangement, thicknesses, order, symmetry, or the like, of layers shown in FIG. 2B is provided as an example. In practice, emitter 200 may include additional layers, fewer layers, different layers, differently constructed layers, or differently arranged layers than those shown in FIG. 2B. Additionally, or alternatively, a set layers (e.g., one or more layers) of emitter 200 may perform one or more functions described as being performed by another set of layers of emitter 200.

Figure 3A:
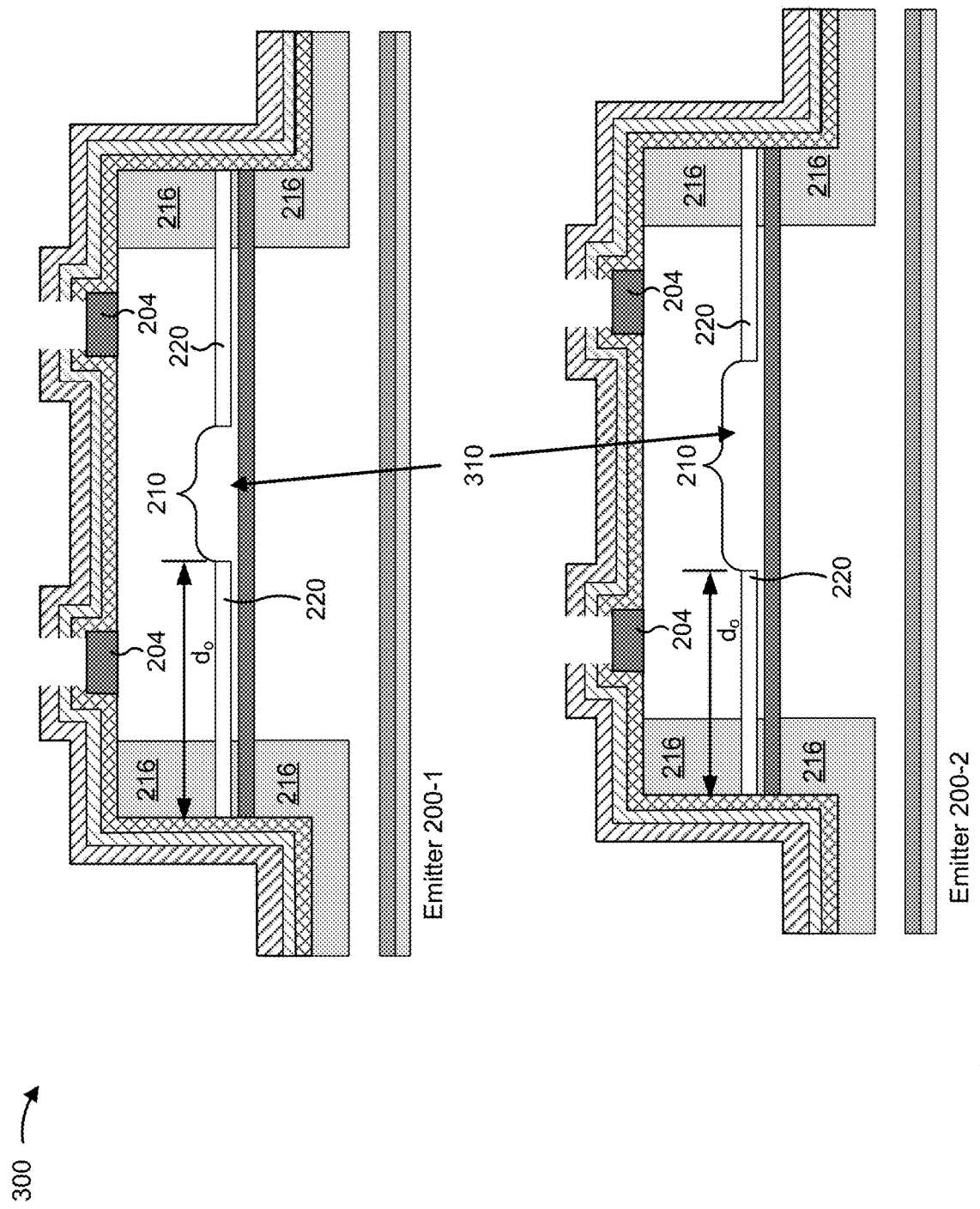
FIGS. 3A and 3B are diagrams of a cross-sectional view of example emitters of an emitter array and a chart showing an impact of current confinement aperture diameter on an electrical resistance of the example emitters, respectively.
Figure 3B:
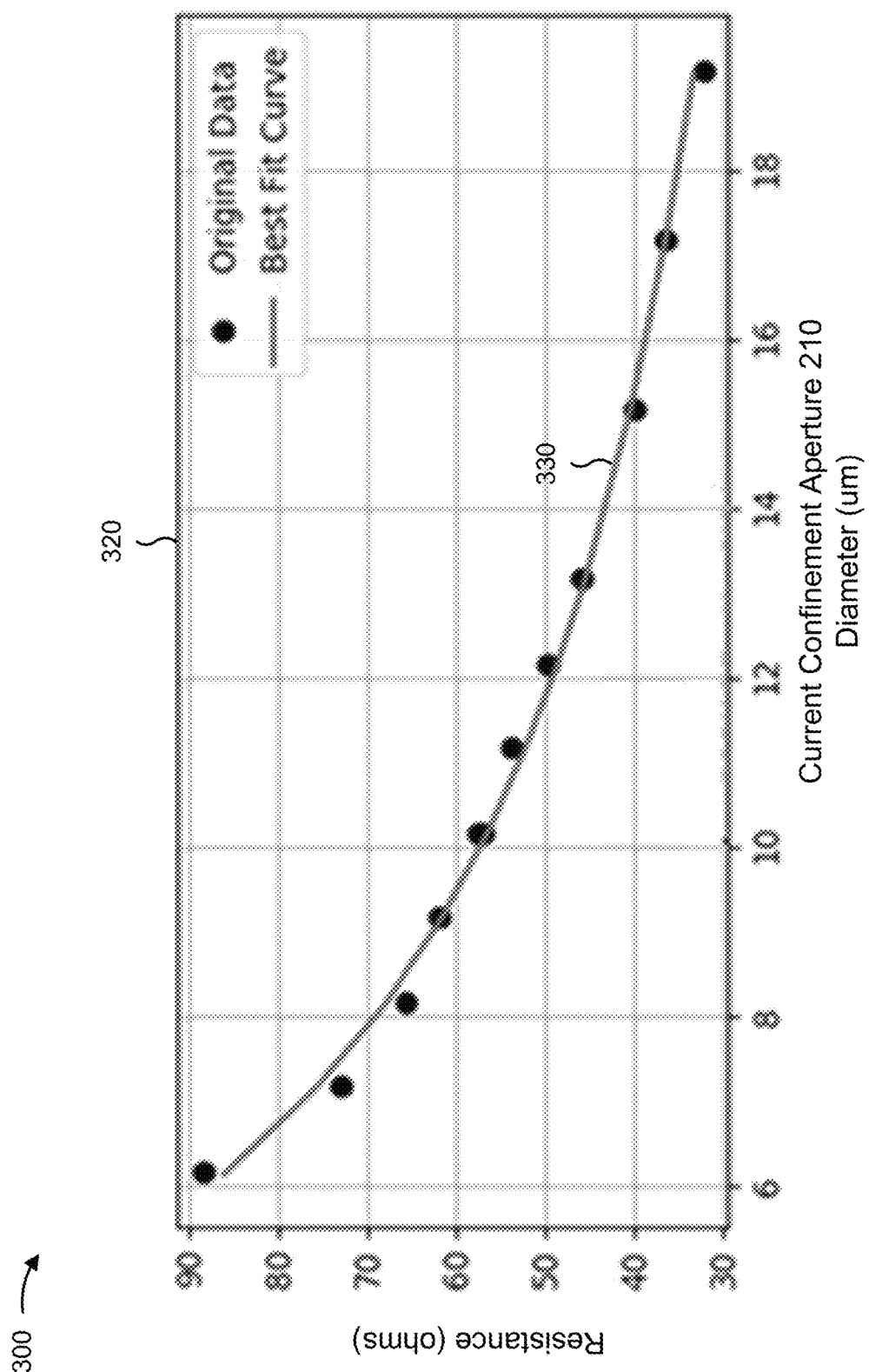

FIGS. 3A and 3B are diagrams of an example implementation 300 depicting a cross-sectional view of example emitters of an emitter array and a chart showing an impact of current confinement aperture diameter on an electrical resistance of the example emitters, respectively.

FIG. 3A shows different emitters 200 of an emitter array with different sized current confinement apertures 210. For example, FIG. 3A shows emitters 200-1 and 200-2 with different sized current confinement apertures 210. For FIGS. 3A and 3B assume, for example, that emitters 200-1 and 200-2 are in the same sub-array and that emitter 200-1 is located closer to a laser driver relative to emitter array 200-2. As shown by reference number 310, emitter 200-1 may have a smaller diameter current confinement aperture 210 relative to emitter 200-2. For example, the particular distance (e.g., identified as $d_o$ in FIG. 3A) for which oxidation of the epitaxial layer has occurred may be longer for emitter 200-1 relative to emitter 200-2, thereby creating a smaller diameter current confinement aperture 210 for emitter 200-1 relative to emitter 200-2.

In some implementations, to increase a diameter of current confinement aperture 210 from one emitter 200 to an adjacent emitter 200, a distance between oxidation trenches between the adjacent emitters 200 may be modified. Additionally, or alternatively, to increase a diameter of current confinement aperture 210 from one emitter 200 to an adjacent emitter 200, a size of a mesa of the emitters 200 may be increased between the adjacent emitters 200 (e.g., a first emitter 200 may have a smaller mesa relative to a second emitter 200, where the first emitter 200 is closer to a laser driver relative to the second emitter 200). Additionally, or alternatively, to increase a diameter of current confinement aperture 210 between adjacent non-oxide emitters 200, a diameter of a regrowth region and/or a tunnel junction region can be modified in a similar manner.

In this way, a diameter of current confinement apertures 210 may be increased for emitter 200 the further emitter 200 is located from a laser driver. This reduces an amount of electrical resistance of emitter 200 the further emitter 200 is from a laser driver, thereby increasing an amount of electric current received by emitter 200 to compensate for an impedance of a metallization layer of a sub-array with which emitter 200 is associated and improving a performance of the sub-array. For example, input current to a first emitter 200 may be represented by the equation $I_j=I_{j-1}$, where $I_j$ is the input current for the first emitter 200 and $I_{j-1}$ is the input current for a second emitter 200 (e.g., an emitter that is closer to a laser driver relative to the first emitter 200). In other words, the electrical impedance of the first emitter 200 may be represented by the equation $Z_j=Z_{j-1}-Z_{Tj}$, where $Z_j$ is the impedance of the first emitter 200, $Z_{j-1}$ is the impedance of the second emitter 200, and $Z_{Tj}$ is the impedance of the metallization layer between the first emitter 200 and the second emitter 200.

In some implementations, the equation $0<Z_{Tj}<Z_{j-1}-Z_j$ may apply to the implementations described herein. This may still reduce non-uniformity of emitters 200 to compensate for impedance. Although described in the context of a diameter of current confinement aperture 210, current confinement aperture 210 may be a shape other than a circle, such as a hexagon, a rectangle, and/or the like.

In some implementations, emitters 200 of a sub-array may be modified in a similar manner to satisfy a threshold optical output power rather than an input current. For example, emitters 200 may be modified such that $P_j=P_{j-1}$ (e.g., where $P_j$ is the optical output power of a first emitter 200 and $P_{j-1}$ is the optical output power of an adjacent emitter closer to a laser driver than $P_j$). In this case, $I_j$ may need to be approximately equal to $I_{j-1}$ but not equal to $I_{j-1}$.

Turning to FIG. 3B, reference number 320 shows an example chart that shows a relationship between a resistance (e.g., in ohms) of emitter 200 and current confinement aperture 210 diameter (e.g., in microns (um)). For example, and as shown by reference number 330, electrical resistance is inversely proportional to current confinement aperture 210 diameter. Continuing with the previous example, larger diameter current confinement apertures 210 are associated with lower amounts of electrical resistance relative to smaller diameter current confinement apertures 210. In this way, a first emitter 200 may have less resistance relative to a second emitter 200 based on the first emitter 200 having a larger diameter current confinement aperture 210 relative to the second emitter 200.

As indicated above, FIGS. 3A and 3B are provided merely as examples. Other examples are possible and may differ from what was described with regard to FIGS. 3A and 3B.

Figure 4:
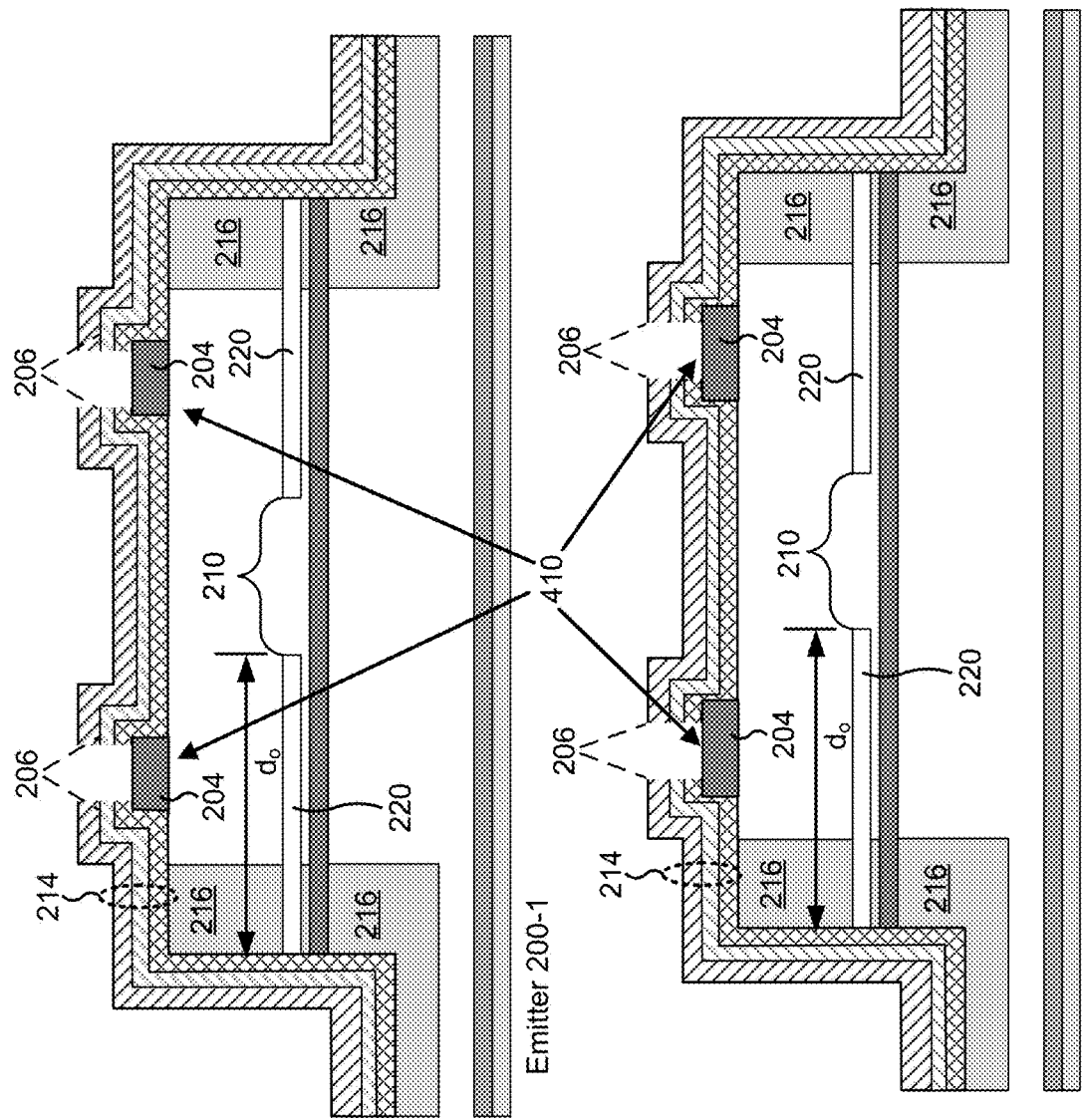
FIG. 4 is a diagram of a cross-sectional view of example emitters of an emitter array.

FIG. 4 is a diagram of an example implementation 400 depicting a cross-sectional view of example emitters of an emitter array. FIG. 4 shows different emitters 200 with different sized contacts (e.g., P-Ohmic metal layer 204) so that the different emitters 200 have different amounts of electrical resistance. For example, FIG. 4 shows emitters 200-1 and 200-2 with different sized P-Ohmic metal layers 204. For FIG. 4 assume, for example, that emitters 200-1 and 200-2 are included in the same sub-array and that emitter 200-1 is located closer to a laser driver relative to emitter array 200-2.

As shown by reference number 410, P-Ohmic metal layer 204 may be wider for emitter 200-2 relative to emitter 200-1 (e.g., P-Ohmic metal layer 204 may be narrower for emitter 200-1 relative to emitter 200-2). In some implementations, compensating for impedance across a sub-array 110 of emitters 200 may depend on a frequency of operation and a geometry of P-Ohmic metal layer 204 (e.g., a width, length, thickness, and/or the like of P-Ohmic metal layer 204) and/or on a change in input power to emitter 200. For example, if input power to emitter 200 is changing by one to 20 percent, then impedance can be compensated by one to 20 percent. In some implementations, a wider P-Ohmic metal layer 204 may be associated with reduced electrical resistance of emitter 200-2 relative to emitter 200-1. For example, a wider P-Ohmic metal layer 204 may compensate for impedance of a metallization layer between emitter 200-1 and 200-2, thereby increasing a voltage of electric current received by emitter 200-2. In some implementations, dielectric via openings 206 may be the same size for both emitter 200-1 and emitter 200-2. In this way, a size of P-Ohmic metal layer 204 may be used to compensate for impedance along a sub-array, by increasing a size of P-Ohmic metal layer 204 emitters 200 that are located further from a laser driver.

As indicated above, FIG. 4 is provided merely as an example. Other examples are possible and may be different from what was described with regard to FIG. 4.

Figure 5:
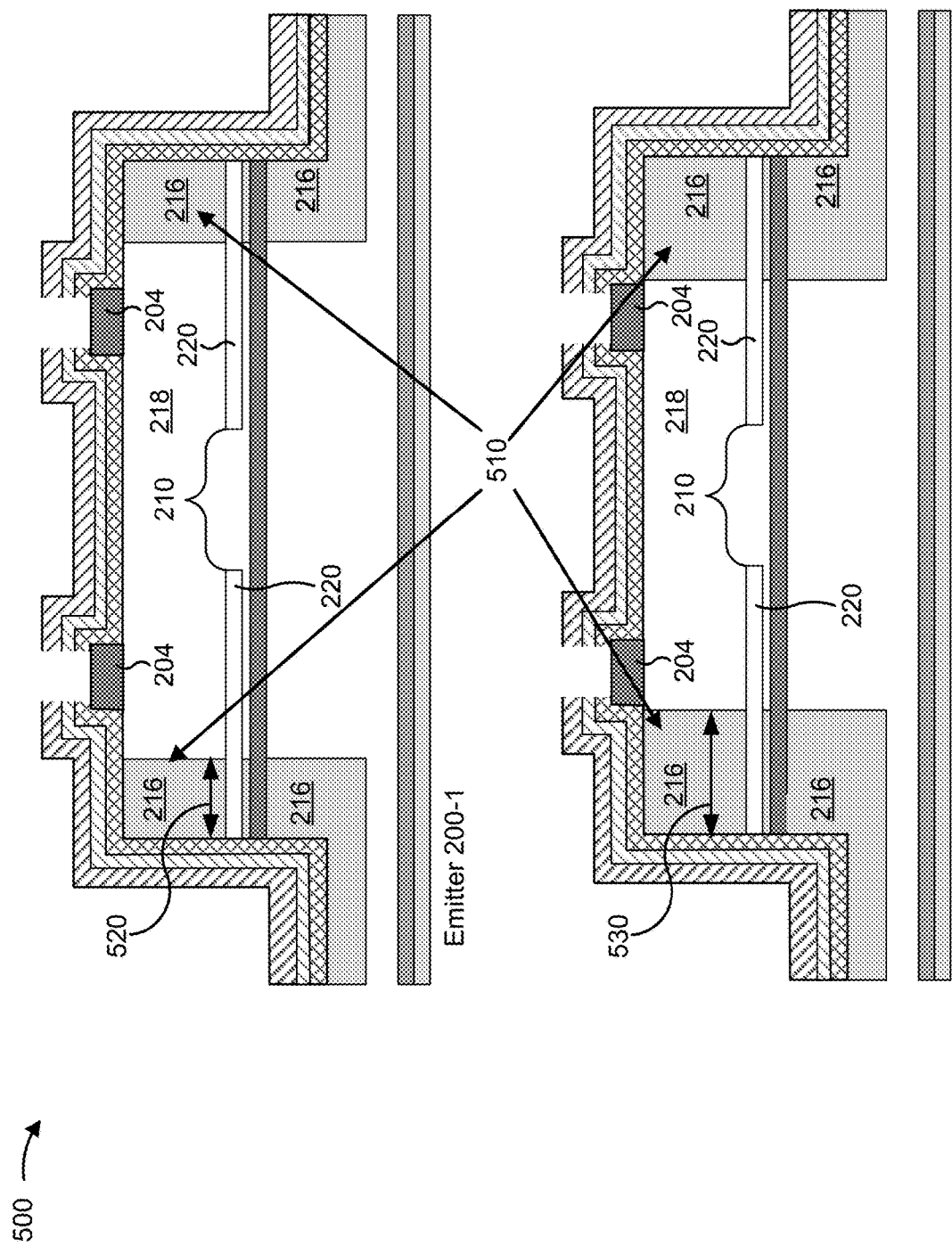
FIG. 5 is a diagram of a cross-sectional view of example emitters of an emitter array.

FIG. 5 is a diagram of an example implementation 500 depicting a cross-sectional view of example emitters of an emitter array. FIG. 5 shows different emitters 200 that differently sized implant isolation material 216 so that the different emitters 200 have different amounts of electrical resistance. For example, FIG. 5 shows emitters 200-1 and 200-2 with differently sized (e.g., different width) implant isolation material 216. For FIG. 5 assume, for example, that emitter 200-1 and 200-2 are included in the same sub-array and that emitter 200-1 is located closer to a laser driver relative to emitter array 200-2.

As shown by reference number 510, implant isolation material 216 for emitter 200-1 may have a smaller width (e.g., may be narrower) relative to implant isolation material 216 for emitter 200-2. For example, the width shown by reference number 520 may be smaller than the width shown by reference number 530. In other words, a width of top mirror 218 and/or bottom mirror 224 may be smaller for emitter 200-1 relative to emitter 200-2. By having an increased width of implant isolation material 216 relative to emitter 200-1, emitter 200-2 may have less electrical resistance relative to emitter 200-1. For example, this modifies a conducting area of the top distributed Bragg reflector (DBR) mirror of emitter 200, which may result in a change in the resistance of sequential emitters 200. In this way, a width of implant isolation material 216 may be used to compensate for impedance along a sub-array.

As indicated above, FIG. 5 is provided merely as an example. Other examples are possible and may differ from what was described with regard to FIG. 5.

Although some implementations were described in the context of a one dimensional sub-array, the implementations apply equally to a two dimensional sub-array. In addition, although some implementations were described in the context of modifying emitters further from a laser driver (e.g., from a normal configuration), the implementations apply equally to modifying emitters closer to the laser driver (e.g., from a normal configuration). For example, rather than increasing a size of current confinement aperture 210 for emitters 200 the further emitters 200 are from a laser driver, a size of current confinement aperture 210 may be decreased for emitters 200 the closer emitters 200 are to the laser driver.

The techniques described herein may be used alone or in combination (e.g., one of them, two of them, all three of them, etc.). In addition, additional techniques related to altering the structure of emitters in an emitter array to compensate for impedance along the emitter array are possible and may different from what was described herein.

In this way, a structure of emitters 200 of a sub-array may be modified across the sub-array so that emitters 200 that are located further from a laser driver have less electrical resistance relative to emitters 200 located closer to the laser driver. This facilitates compensation of impedance along a metallization layer of the sub-array, thereby increasing an amount of electric current received by emitters 200 the further emitters 200 are located from a laser driver. In addition, this improves a performance of a sub-array by reducing a likelihood that emitters 200 fail due to a lack of a threshold voltage. Further, this facilitates more consistent light output by emitters 200 of a sub-array, thereby improving light output of the sub-array. Further, this facilitates flow of a similar amount of electric current to emitters 200 of a sub-array (or to reduce the difference between amounts of electric current received by emitters 200 of the sub-array).

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A vertical cavity surface emitting laser (VCSEL) array, comprising:
    a plurality of VCSELs; and
    a metallization layer to electrically connect the plurality of VCSELs,
        wherein the metallization layer has a first end and a second end,
        wherein the plurality of VCSELs includes a first VCSEL and a second VCSEL,
        wherein the first VCSEL is located closer to the first end than the second VCSEL,
        wherein a first structure, included in the first VCSEL, is different than a second structure, included in the second VCSEL, in accordance with a difference in a first electrical impedance of the first VCSEL and a second electrical impedance of the second VCSEL when the metallization layer is powered, and
        wherein the metallization layer is not included in the first structure or the second structure.

2. The VCSEL array of claim 1, wherein a first current confinement aperture of the first VCSEL has a smaller diameter relative to a second current confinement aperture of the second VCSEL,
    wherein the first current confinement aperture is the first structure and the second current confinement aperture is the second structure.

3. The VCSEL array of claim 1, wherein a first contact of the first VCSEL is narrower than a second contact of the second VCSEL,
    wherein the first contact is the first structure and the second contact is the second structure.

4. The VCSEL array of claim 1, wherein a first implant isolation material of the first VCSEL is wider than a second implant isolation material of the second VCSEL,
    wherein the first implant isolation material is the first structure and the second implant isolation material is the second structure.

5. The VCSEL array of claim 1, wherein a difference between a first input power of the first VCSEL and a second input power of the second VCSEL satisfies a threshold.

6. The VCSEL array of claim 1, wherein a difference between a first resistance of the first VCSEL and a second resistance of the second VCSEL satisfies a threshold.

7. The VCSEL array of claim 1, further comprising:
    a laser driver electrically connected to the first end of the metallization layer,
        wherein the laser driver is configured to power the first VCSEL and the second VCSEL.

8. An emitter array, comprising:
    a plurality of emitters; and
    a metallization layer to electrically connect the plurality of emitters,
        wherein the metallization layer has a first end and a second end,
        wherein the plurality of emitters includes a first emitter and a second emitter,
        wherein the first emitter is located closer to the first end than the second emitter,
        wherein the first emitter and the second emitter have differently sized structures to compensate for a first impedance of the metallization layer between the first end and the first emitter and a second impedance between the first end and the second emitter, and
        wherein the metallization layer is not included in a portion of the first emitter or the second emitter that includes the differently sized structures.

9. The emitter array of claim 8, wherein the first emitter and the second emitter have differently sized current confinement apertures relative to each other as the differently sized structures.

10. The emitter array of claim 8, wherein the first emitter and the second emitter have differently sized P-Ohmic contacts relative to each other as the differently sized structures.

11. The emitter array of claim 8, wherein the first emitter and the second emitter have differently sized implant isolation material relative to each other as the differently sized structures.

12. The emitter array of claim 8, wherein the first emitter and the second emitter emit an amount of light within a threshold amount of each other based on the differently sized structures.

13. The emitter array of claim 8, wherein a first structure of the first emitter compensates for the first impedance.

14. The emitter array of claim 13, wherein a second structure of the second emitter compensates for the second impedance,
    wherein the first emitter and the second emitter receive a same amount of power based on the first structure and the second structure,
    wherein the first structure and the second structure are the differently sized structures.

15. A laser array, comprising:
a plurality of laser devices; and
a metallization layer to electrically connect the plurality of laser devices,
  wherein the metallization layer has a first end and a second end,
  wherein the plurality of laser devices includes a first laser device and a second laser device,
  wherein the first laser device is located closer to the first end than the second laser device,
  wherein the first laser device and the second laser device have different structures that are configured such that a difference between a first input power to the first laser device and a second input power to the second laser device satisfies a threshold, and
  wherein the metallization layer is not included in a portion of the first laser device or the second laser device that includes the different structures.

16. The laser array of claim 15, wherein the first laser device is associated with a first current confinement aperture and the second laser device is associated with a second current confinement aperture,
  wherein the second current confinement aperture is wider than the first current confinement aperture so that the difference between the first input power and the second input power satisfies the threshold,
  wherein the first current confinement aperture and the second current confinement aperture are the different structures.

17. The laser array of claim 15, wherein the first laser device is associated with a first contact and the second laser device is associated with a second contact,
  wherein the second contact is wider than the first contact so that the difference between the first input power and the second input power satisfies the threshold,
  wherein the first contact and the second contact are the different structures.

18. The laser array of claim 15, wherein the first laser device is associated with a first implant isolation material and the second laser device is associated with a second implant isolation material,
  wherein the second implant isolation material is wider than the first implant isolation material so that the difference between the first input power and the second input power satisfies the threshold,
  wherein the first implant isolation material and the second implant isolation material are the different structures.

19. The laser array of claim 15, wherein the different structures cause another difference between a first resistance associated with the first laser device and a second resistance associated with the second laser device to satisfy another threshold.

20. The laser array of claim 15, wherein the different structures cause another difference between a first output power associated with the first laser device and a second output power associated with the second laser device to satisfy another threshold.

* * * * *